United States Patent
Falguier et al.

(10) Patent No.: US 12,477,679 B2
(45) Date of Patent: Nov. 18, 2025

(54) ELECTRONIC UNIT FOR A VOLTAGE CONVERTER OF A ROTATING ELECTRIC MACHINE

(71) Applicant: VALEO EQUIPEMENTS ELECTRIQUES MOTEUR, Creteil (FR)

(72) Inventors: Manuel Falguier, Creteil (FR); Christopher Riche, Creteil (FR); Philippe Mercier, Sable sur Sarthe (FR)

(73) Assignee: VALEO EQUIPEMENTS ELECTRIQUES MOTEUR, Creteil (FR)

( * ) Notice: Subject to any disclaimer, the term of this patent is extended or adjusted under 35 U.S.C. 154(b) by 152 days.

(21) Appl. No.: 18/261,219

(22) PCT Filed: Jun. 20, 2022

(86) PCT No.: PCT/EP2022/066672
§ 371 (c)(1),
(2) Date: Jul. 12, 2023

(87) PCT Pub. No.: WO2022/268681
PCT Pub. Date: Dec. 29, 2022

(65) Prior Publication Data
US 2024/0064920 A1    Feb. 22, 2024

(30) Foreign Application Priority Data

Jun. 23, 2021 (FR) ........................... 2106718

(51) Int. Cl.
*H05K 7/14*    (2006.01)
*H02K 5/22*    (2006.01)

(52) U.S. Cl.
CPC ......... *H05K 7/14329* (2022.08); *H02K 5/225* (2013.01); *H05K 7/14322* (2022.08)

(58) Field of Classification Search
CPC .......... H05K 7/14329; H05K 7/14322; H02K 5/225; H02K 11/33
(Continued)

(56) References Cited

U.S. PATENT DOCUMENTS

2009/0200879 A1*  8/2009  Ghodsi-Khameneh ..................... H02K 3/522
                                                                                                  310/71
2009/0237905 A1   9/2009  Motoda
(Continued)

FOREIGN PATENT DOCUMENTS

EP   2 643 919 A1   10/2013
FR   3 093 889 A1   9/2020

OTHER PUBLICATIONS

International Search Report Issued Sep. 19, 2022, in PCT/EP2022/066672, filed on Jun. 20, 2022, 2 pages.

*Primary Examiner* — Jeremy A Luks
(74) *Attorney, Agent, or Firm* — Oblon, McClelland, Maier & Neustadt, L.L.P.

(57) ABSTRACT

An electronic unit for a voltage converter of a rotating electric machine includes a first busbar including a first plate, a first connection portion projecting from the first plate, on a first side of the first plate. A first connection surface is able to be welded to a second connection surface of a third busbar of a power electronics module by a first laser weld using a first laser beam. A second busbar separate includes a second plate parallel to and located on a second side of the first plate, opposite the first side. The first or second busbar includes a first extension extending in line with the first connection surface, the first extension being able to block the first laser beam. A voltage converter can (Continued)

Figure 1:
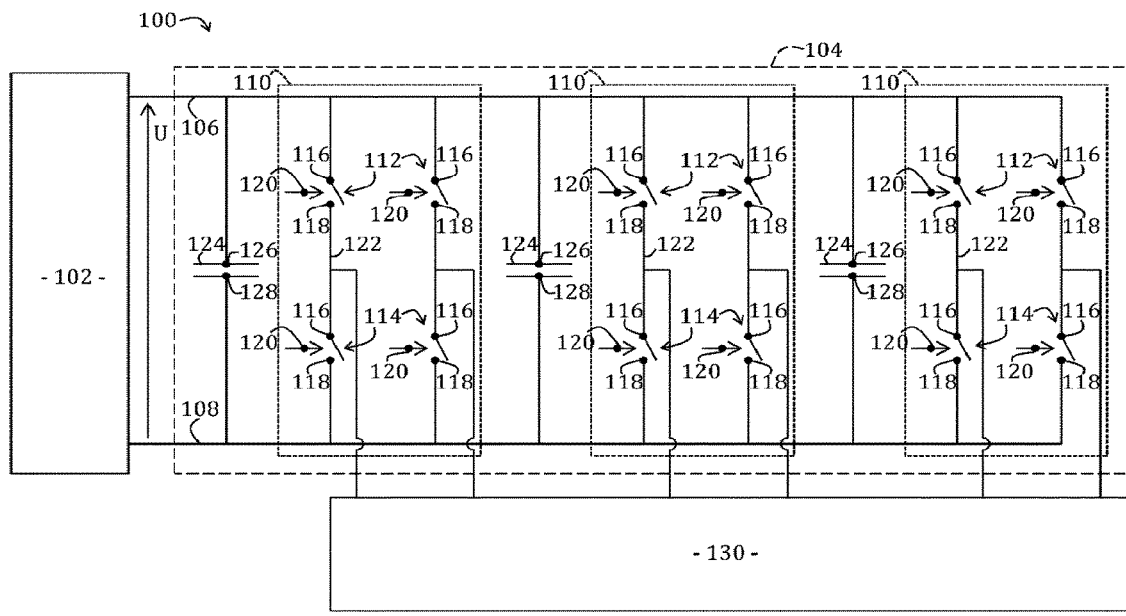

include the electronic unit, and the electrical assembly can include the voltage converter and a rotating electric machine.

20 Claims, 7 Drawing Sheets

(58) Field of Classification Search
USPC .......................................................... 310/71
See application file for complete search history.

(56) References Cited

U.S. PATENT DOCUMENTS

2021/0006177 A1\* 1/2021 Uneme ................. H02M 7/003
2023/0098997 A1\* 3/2023 Fiederling .............. H02K 1/146
310/71

\* cited by examiner

ELECTRONIC UNIT FOR A VOLTAGE CONVERTER OF A ROTATING ELECTRIC MACHINE

The invention relates to an electronic unit for a voltage converter of a rotating electric machine. The invention also relates to a voltage converter equipped with such an electronic unit, and to an electrical assembly comprising such a voltage converter and a rotating electric machine.

Document FR3093889 A1 discloses an electronic unit for a voltage converter of a rotating electric machine comprising:
- a first busbar comprising:
  - a first plate,
  - a first connection portion projecting from the first plate, on a first side of the first plate, perpendicular to the first plate, the first connection portion comprising a first connection surface able to be welded to a second connection surface, facing the first connection surface, of a third busbar of a power electronics module by a laser weld using a laser beam passing at the interface between the first connection surface and the second connection surface,
- a second busbar separate from the first busbar and comprising a second plate parallel to the first plate and located on a second side of the first plate, opposite the first side,
- a housing electrically isolating the first busbar from the second busbar,
- a metal cover able to block the laser beam.

Such an electronic unit addresses the need to block the laser beam during the welding of the first connection surface and second connection surface. However, such an electronic unit is complex and requires the use of a cover, which may entail the use of seals.

The present invention seeks to overcome all or some of these drawbacks.

The invention relates to an electronic unit for a voltage converter of a rotating electric machine comprising:
- a first busbar comprising:
  - a first plate,
  - a first connection portion projecting from the first plate, on a first side of the first plate, the first connection portion comprising a first connection surface, the first connection surface forming a first angle with the first plate, the first connection surface being able to be welded to a second connection surface, facing and parallel to the first connection surface, of a third busbar of a power electronics module by a first laser weld using a first laser beam passing at a first interface between the first connection surface and the second connection surface,
- a second busbar separate from the first busbar and comprising a second plate parallel to the first plate and located on a second side of the first plate, opposite the first side,
- a first housing electrically isolating the first busbar from the second busbar,
- wherein the first busbar or the second busbar comprises a first extension extending in line with the first connection surface, the first extension being able to block the first laser beam, and
- wherein the first housing comprises a first free area in line with the first connection surface, the first free area being able to leave the first extension exposed for the first laser beam.

The use of such a first extension makes it possible to block the first laser beam without adding a complex cover, in particular requiring a seal, to achieve this function of blocking the first laser beam. The production of such an electronic unit is therefore easier to manufacture and has a lower cost. In addition, the production of the first free area makes it possible not to interrupt the first laser beam before it is blocked by the first extension. This thus limits degradation of the first housing during the first laser welding. Fumes and projections of degraded material from the first housing during the first laser welding are reduced or avoided. It is thus possible to avoid the use of expensive fume treatment devices. It is also possible to avoid a cleaning operation after producing the first laser weld. The manufacturing cost of the electronic unit is therefore reduced.

According to one additional feature of the invention, the first extension is perpendicular to the first connection surface.

Such an orientation for the first extension with respect to the first connection surface makes it possible to prevent the reflection of the first laser beam from reaching surrounding parts of the electronic unit, in particular the first housing, as well as other elements located around the electronic unit.

According to one additional feature of the invention, the first extension extends by more than 0.5 mm, in particular by more than 1 mm, with respect to the projection of the first connection surface on the first extension in a direction perpendicular to the first extension.

Such a length for the first extension contributes to improving the blocking of the laser beam by the first extension.

According to one additional feature of the invention, the first connection portion is formed in one piece with the first plate.

Such a first connection portion makes it possible to simplify the manufacture of the first busbar. The first busbar is for example formed by bending. The cost of the first busbar may thus be reduced.

According to one additional feature of the invention, the first extension is formed in one piece with the second plate.

Such a first extension does not require any additional part to block the first laser beam. It therefore makes it possible to simplify and reduce the cost of the electronic unit.

According to one additional feature of the invention, the first extension is a third plate attached directly to the first plate.

The direct attachment is for example a weld, a brazing joint or a clinching joint. The use of a brazing strap between the first plate and the first extension for a brazing-based attachment is considered, within the meaning of the invention, to be a direct attachment.

According to one additional feature of the invention, the second busbar comprises a second connection portion projecting from the second plate, on a first side of the second plate, the second connection portion comprising a third connection surface, the third connection surface forming a second angle with the second plate, the third connection surface being able to be welded to a fourth connection surface, facing and parallel to the third connection surface, of a fourth busbar of a power electronics module by a second laser weld using a second laser beam passing at a second interface between the third connection surface and the fourth connection surface,
  the second busbar comprising a second extension extending in line with the third connection surface, the second extension being able to block the second laser beam,
  the second extension being a fourth plate attached directly to the second plate, and wherein the first housing comprises a second free area in line with the third connection surface, the second free area being able to leave the second extension exposed for the second laser beam.

The use of such a second extension makes it possible to block the second laser beam without adding a complex cover, in particular requiring a seal, to achieve this function of blocking the first laser beam. The production of such an electronic unit is therefore easier to manufacture and has a lower cost. In addition, the production of the second free area makes it possible not to interrupt the second laser beam before it is blocked by the second extension. This thus limits degradation of the first housing during the second laser welding. Fumes and projections of degraded material from the first housing during the second laser welding are reduced or avoided. It is thus possible to avoid the use of expensive fume treatment devices. It is also possible to avoid a cleaning operation after carrying out the second laser weld. The manufacturing cost of the electronic unit is therefore reduced.

According to one additional feature of the invention, the fourth plate has the same thickness as the first plate or the same thickness as the second plate.

Such a fourth plate may make it possible to produce the fourth plate from an offcut of the first plate or an offcut of the second plate. The cost of the material needed to produce the fourth plate is thus reduced.

According to one additional feature of the invention, the first housing is overmolded onto the first busbar and the second busbar.

The use of overmolding makes it possible to reduce the number of parts of the electronic unit and may therefore make it possible to reduce its cost.

According to one additional feature of the invention, the electronic unit for a voltage converter of a rotating electric machine comprises a capacitor, a first terminal of which is electrically connected directly to the first busbar, in particular by welding, brazing or crimping, and a second terminal of which is electrically connected directly to the second busbar, in particular by welding, brazing or crimping.

The use of a capacitor makes it possible to filter the power supply of a power electronics module.

According to one additional feature of the invention, the first housing comprises a wall forming a chimney surrounding the first terminal and the second terminal, the chimney being able to receive a protective resin so as to protect the electrical connection between the first busbar and the first terminal and the electrical connection between the second busbar and the second terminal.

The use of such a wall makes it possible to protect the electrical connections of the capacitor with a resin without it being necessary to add a part forming an edge. The number of parts of the electronic unit is reduced, thereby possibly also enabling a reduction in the cost of the electronic unit.

According to one additional feature of the invention, the first angle has a value equal to 90°.

According to one additional feature of the invention, the second angle has a value equal to 90°.

The invention also relates to a voltage converter of a rotating electric machine comprising an electronic unit as described above and a power electronics module able to supply electric power to a winding of a rotating electric machine.

According to one additional feature of the invention, the power electronics module comprises a second housing, the second housing being overmolded onto the third busbar and the fourth busbar.

According to one additional feature of the invention, the first busbar is a negative busbar and the second busbar is a positive busbar.

According to one additional feature of the invention, the power electronics module comprises a third busbar and a fourth busbar, the first busbar being welded to the third busbar by a first laser weld and the second busbar being welded to the fourth busbar by a second laser weld.

The invention also relates to an electrical assembly comprising a voltage converter as described above and a rotating electric machine.

In all of the above, the electrical assembly may have both an alternator function and an electric motor function. Thus, during operation as an alternator, the electrical assembly supplies electrical energy in the direction of the power source from the rotation of an output shaft of the rotating electric machine. The voltage converter then operates as a rectifier. During operation as an electric motor, the rotating electric machine 130 drives the output shaft. The voltage converter then operates as an inverter.

The rotating electric machine may comprise, on the output shaft, a pulley or any other means for connection to the rest of a powertrain of the vehicle. The rotating electric machine is for example connected, in particular via a belt, to the crankshaft of a combustion engine of the vehicle. As a variant, the electric machine is connected at other locations in the powertrain, for example at the input of the gearbox with regard to the torque passing toward the wheels of the vehicle, at the output of the gearbox with regard to the torque passing toward the wheels of the vehicle, at the gearbox with regard to the torque passing toward the wheels of the vehicle, or on the front axle assembly or the rear axle assembly of this powertrain.

The rotating electric machine may comprise a rotor comprising any number of pairs of poles, for example six or eight pairs of poles. The rotating electric machine may have a stator having a polyphase electrical winding, for example formed by wires or by conductive bars connected to one another.

Figure 2:
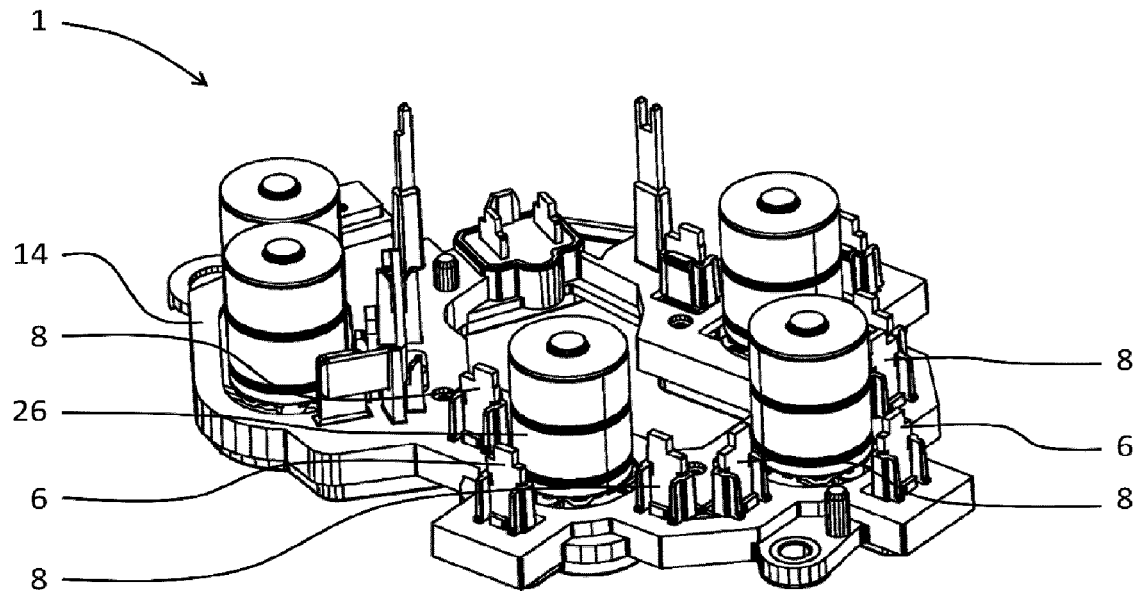
Figure 3:
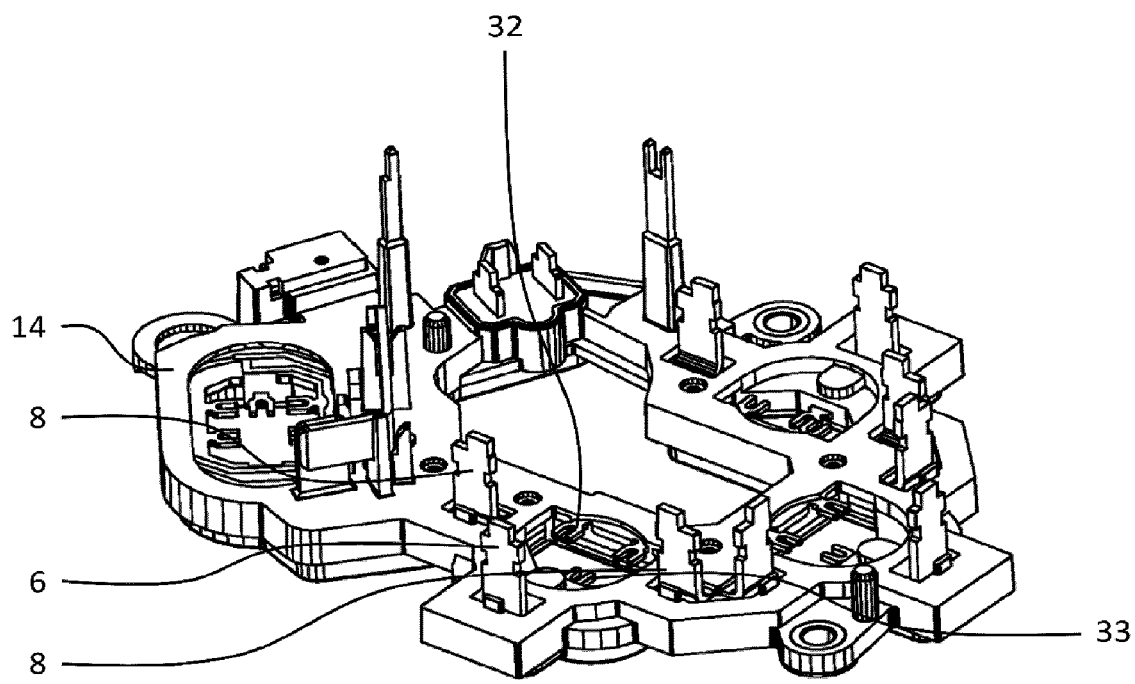
Figure 4:
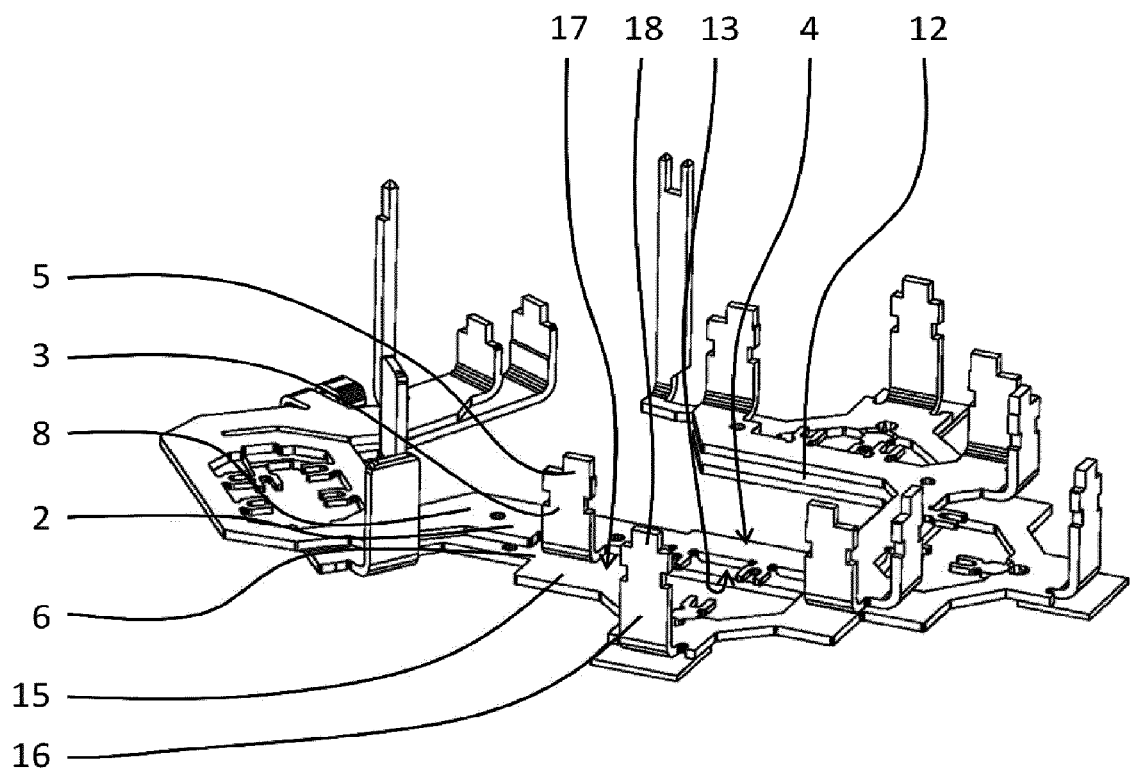
Figure 5:
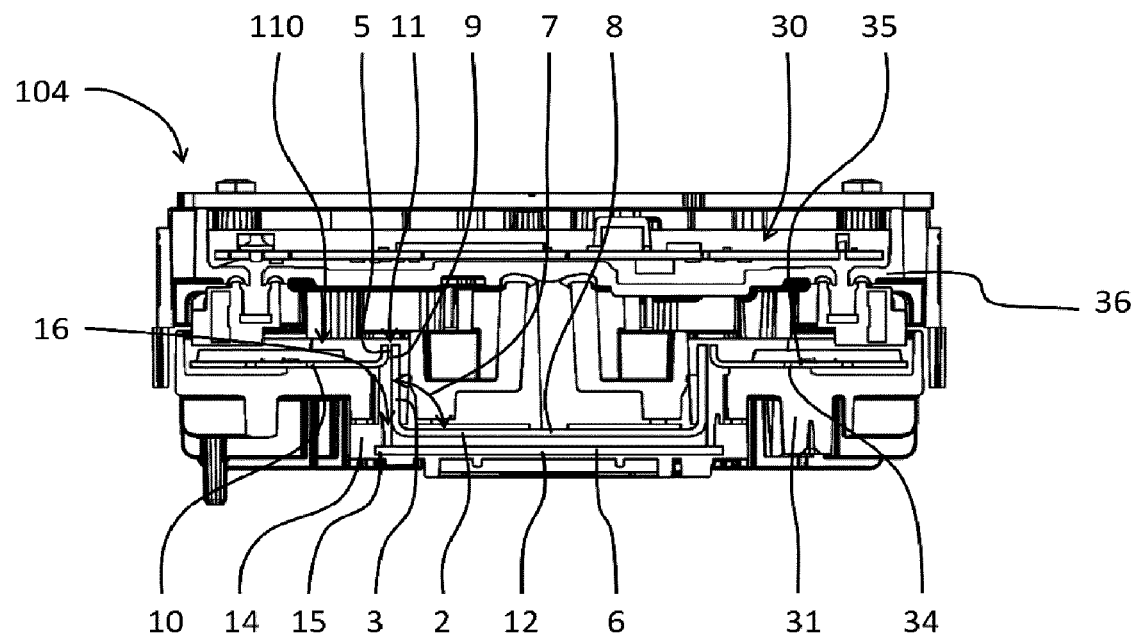
Figure 6:
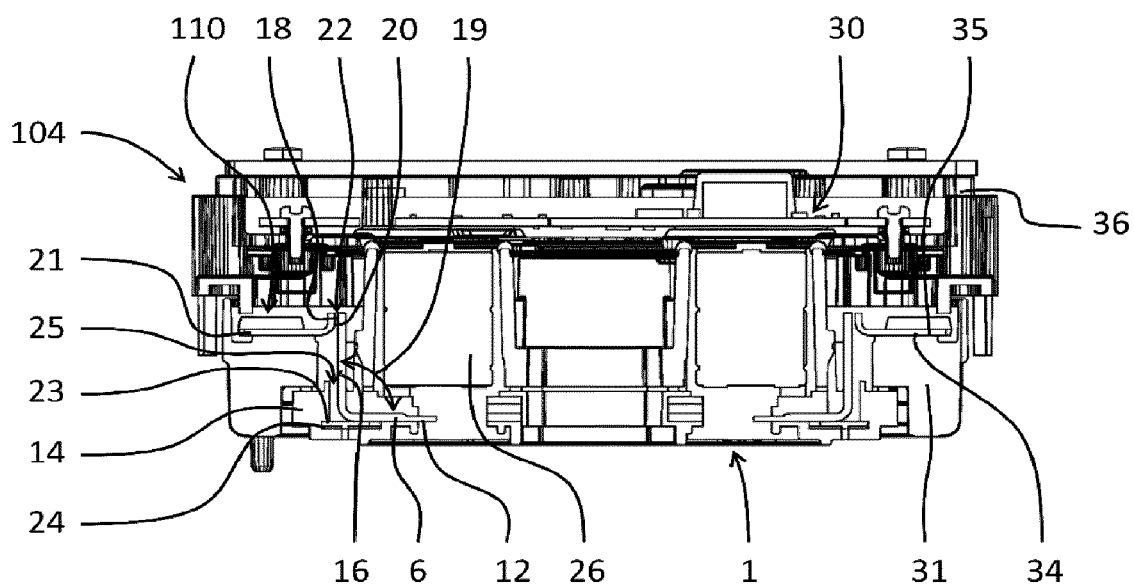
Figure 7:
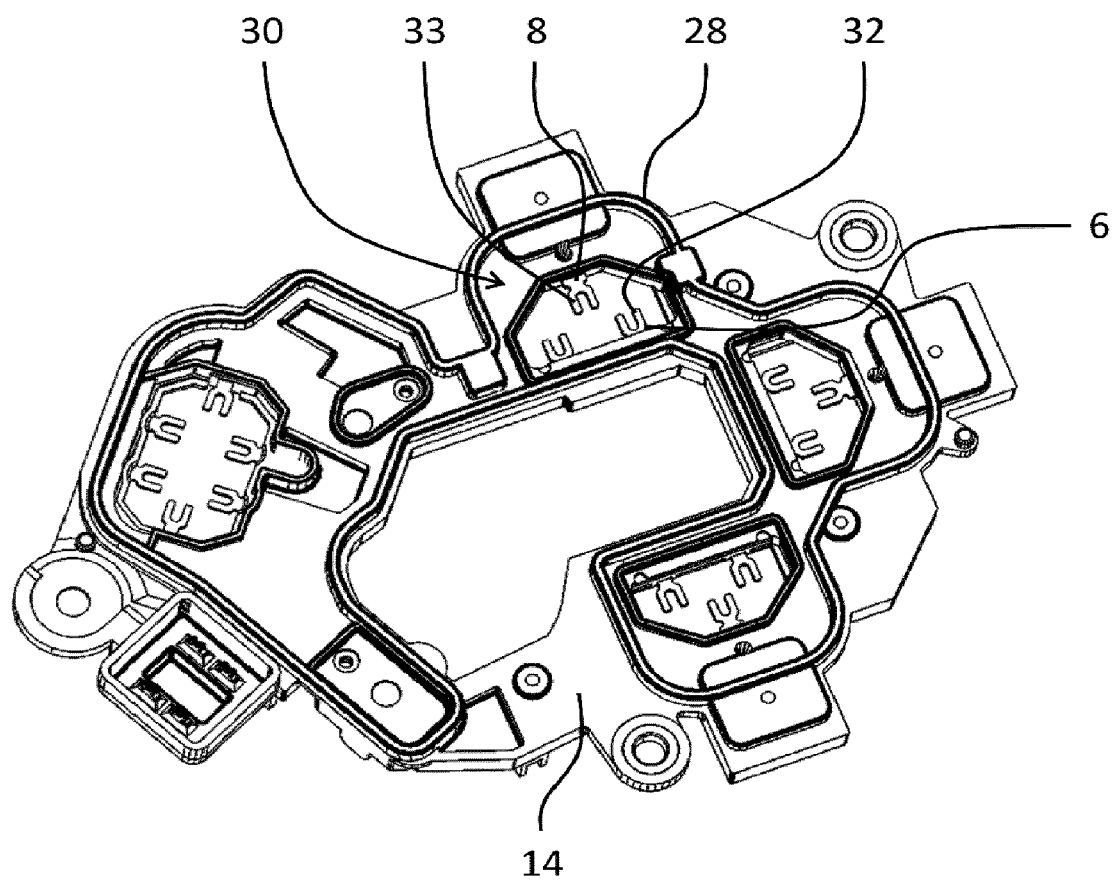
Figure 8:
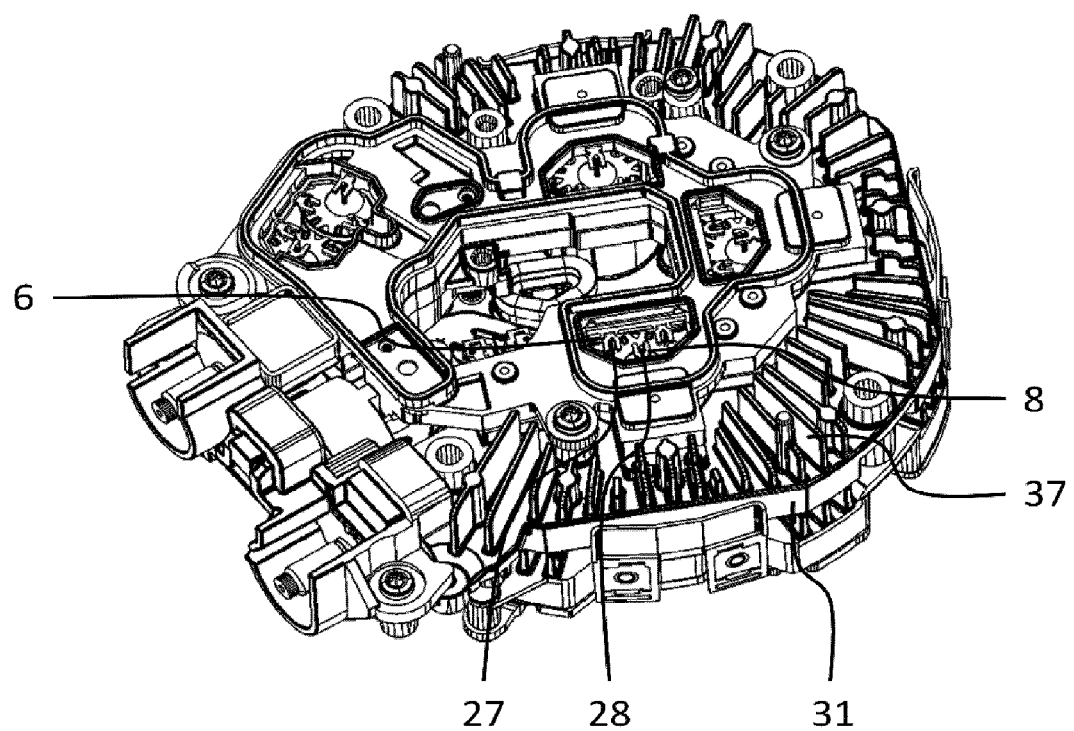
Figure 9:
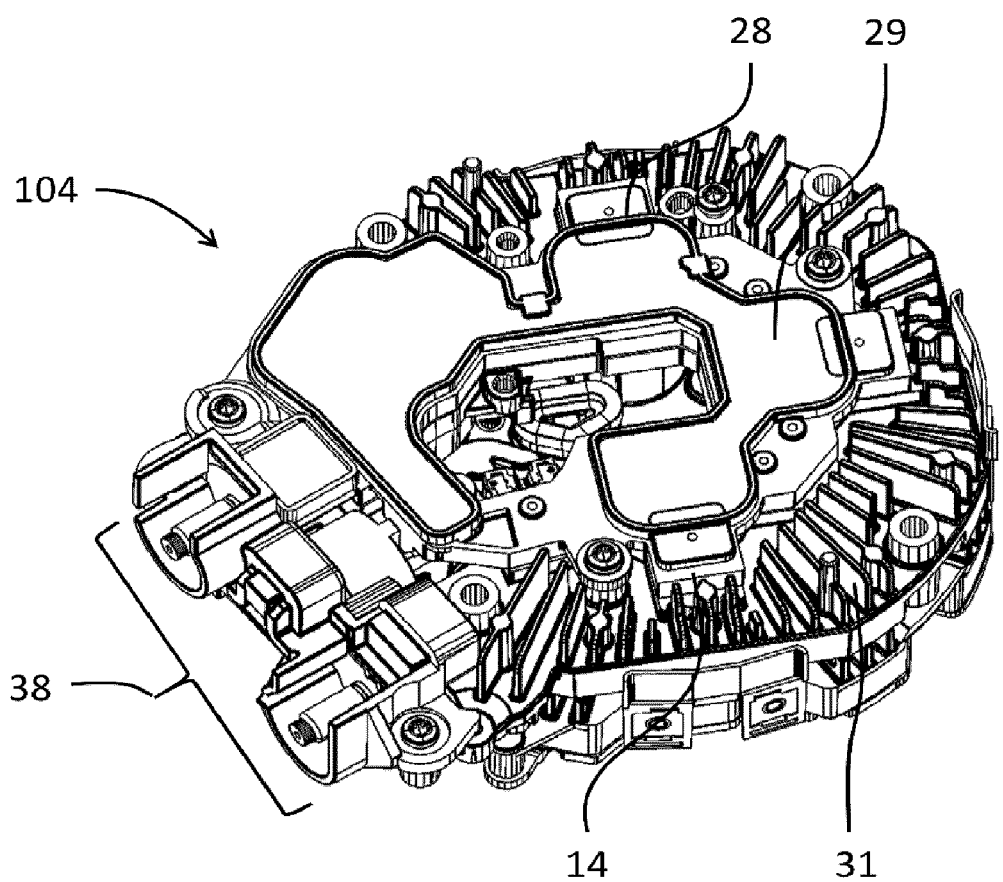

The invention may be understood better upon reading the following description of non-limiting exemplary implementations thereof and upon studying the appended drawing, in which:

FIG. 1 shows a circuit diagram of an electrical assembly comprising an electronic unit according to the invention, FIG. 2 shows a schematic view of an electronic unit according to the invention, FIG. 3 shows a partial schematic view of the electronic unit of FIG. 2, FIG. 4 shows another partial schematic view of the electronic unit of FIG. 2, FIG. 5 shows a sectional schematic view of a voltage converter comprising the electronic unit of FIG. 2, FIG. 6 shows another sectional schematic view of the voltage converter of FIG. 5, FIG. 7 shows another partial schematic view of the electronic unit of FIG. 2, FIG. 8 shows a partial schematic view of the voltage converter of FIG. 5, FIG. 9 shows another partial schematic view of the voltage converter of FIG. 5.

Throughout the figures, elements that are identical or perform the same function bear the same reference numbers. The following embodiments are examples. Although the description refers to one or more embodiments, this does not necessarily mean that each reference relates to the same embodiment, or that the features apply only to one embodiment. Individual features of various embodiments may also be combined or interchanged in order to create other embodiments.

FIG. 1 shows an electrical assembly 100 in which the invention may be implemented.

The electrical assembly 100 is for example intended to be installed in a motor vehicle.

The electrical assembly 100 firstly comprises a power source 102 designed to deliver a DC voltage U, for example between 20 V and 100 V, for example 48 V. The power source 102 comprises for example a battery.

The electrical assembly 100 furthermore comprises a rotating electric machine 130 comprising multiple phase windings (not shown) that are intended to have respective phase voltages.

The electrical assembly 100 furthermore comprises an electronic system 104.

In the various embodiments shown in the figures, the electronic system 104 is a voltage converter 104. However, in other embodiments that are not shown, the assembly may perform a different function.

The voltage converter 104 is connected between the power source 102 and the rotating electric machine 130 in order to perform a conversion between the DC voltage U and the phase voltages.

The voltage converter 104 firstly comprises a positive electric line 106 and a negative electric line 108 that are intended to be connected to the power source 102 in order to receive the DC voltage U, the positive electric line 106 receiving a high electrical potential and the negative electric line 108 receiving a low electrical potential.

The voltage converter 104 furthermore comprises at least one power electronics module 110 comprising one or more phase electric lines 122 that are intended to be respectively connected to one or more phases of the rotating electric machine 130 in order to provide their respective phase voltages.

In the example described, the voltage converter 104 comprises three power electronics modules 110, each comprising two phase electric lines 122 connected to two phases of the electric machine 130.

More specifically, in the example described, the electric machine 130 has two three-phase systems, each having three phases and intended to be electrically phase-shifted by 120° with respect to one another. Preferably, the first phase electric lines 122 of the power electronics modules 110 are respectively connected to the three phases of the first three-phase system, whereas the second phase electric lines 122 of the power electronics modules 110 are respectively connected to the three phases of the second three-phase system.

Each power electronics module 110 comprises, for each phase electric line 122, a first controllable switch 112 connected between the positive electric line 106 and the phase electric line 122 and a second controllable switch 114 connected between the phase electric line 122 and the negative electric line 108. Thus, the controllable switches 112, 114 are arranged so as to form a chopping arm, in which the phase electric line 122 forms a center tap.

Each controllable switch 112, 114 comprises first and second main terminals 116, 118 and a control terminal 120 that is intended to selectively open and close the controllable switch 112, 114 between its two main terminals 116, 118 depending on a control signal that is applied thereto. The controllable switches 112, 114 are preferably transistors, for example Metal-Oxide-Semiconductor Field-Effect Transistors (MOSFETs) having a gate forming the control terminal 120, and a drain and a source forming the main terminals 116, 118, respectively.

In the example described, the controllable switches 112, 114 each have the form of a plate, which is for example substantially rectangular, having an upper face and a lower face. The first main terminal 116 extends over the lower face, whereas the second main terminal 118 extends over the upper face. Furthermore, the lower face forms a heat dissipation surface.

The voltage converter 104 furthermore comprises, for each power electronics module 110, a filtering capacitor 124 having a first terminal 126 and a second terminal 128 that are connected to the positive electric line 106 and to the negative electric line 108, respectively.

It will be appreciated that the positive electric line 106, the negative electric line 108 and the phase electric lines 122 are rigid elements designed to withstand electric currents of at least 1 A. They preferably have a thickness of at least 1 mm.

FIG. 2 shows a schematic view of an electronic unit 1 for a voltage converter 104 of a rotating electric machine 130 according to the invention. The electronic unit 1 comprises a first busbar 8, a second busbar 6 separate from the first busbar 8 and a first housing 14 electrically isolating the first busbar 8 from the second busbar 6.

The first busbar 8 is for example a negative busbar. The first busbar 8 is for example electrically connected to the negative electric line 108. The second busbar 6 is for example a positive busbar. The second busbar 6 is for example electrically connected to the positive electric line 106. The first housing 14 is for example overmolded onto the first busbar 8 and the second busbar 6.

In another embodiment of the invention, not shown, the first housing comprises a set of insulating walls, for example three insulating walls, which are joined together in particular by clipping.

The electronic unit 1 may furthermore comprise a capacitor 26. The capacitor is for example the filtering capacitor 124. The capacitor 26 may comprise a first terminal 27 that is electrically connected directly to the first busbar 8. In the embodiment shown in the figures, the first terminal 27 is electrically connected to the first busbar 8 by crimping. As shown in FIG. 3 and in FIG. 7, the first busbar 8 may comprise a first fork 32 comprising two branches between which the first terminal 27 is crimped. In the embodiment of the invention shown in the figures, the electronic unit 1 comprises multiple capacitors 26. Each of the capacitors comprises two first terminals 27 each crimped in a first fork 32.

In another embodiment of the invention, not shown, the first terminal 27 is electrically connected to the first busbar by welding or brazing.

The capacitor 26 may comprise a second terminal 28 that is electrically connected directly to the second busbar 6. In the embodiment shown in the figures, the second terminal 28 is electrically connected to the second busbar 6 by crimping. As shown in FIG. 3, the second busbar 6 may comprise a second fork 33 comprising two branches between which the second terminal 28 is crimped.

In another embodiment of the invention, not shown, the second terminal 28 is electrically connected to the second busbar by welding or brazing.

FIG. 8 shows the crimping-based electrical connection between the first terminal 27 and the first busbar 8 and the crimping-based electrical connection between the second terminal 28 and the second busbar 6.

The first housing 14 may comprise a wall 28 forming a chimney 30 surrounding the first terminal 27 and the second terminal 28. The chimney 30 may receive a protective resin 29 so as to protect the electrical connection between the first busbar 8 and the first terminal 27 and the electrical connection between the second busbar 6 and the second terminal 28. In the embodiment shown in the figures, the chimney 30 may receive a protective resin 29 able to protect the first terminals 27 and second terminal 28 of a plurality of capacitors 26.

In another embodiment of the invention, not shown, each of the capacitors has its own chimney for protecting the electrical connection between the first busbar and the first terminal and the electrical connection between the second busbar and the second terminal.

FIG. 9 shows a current converter 104 comprising the electronic unit in which resin 29 has been inserted into the chimney 30.

FIG. 3 shows a schematic view of the first busbar 8 and the second busbar 6.

The first busbar 8 comprises a first plate 2 and a first connection portion 3. The first connection portion 3 projects from the first plate 2 on a first side 4 of the first plate 2. The first connection portion 3 comprises a first connection surface 5. The first connection surface 5 forms a first angle 7 with the first plate 2.

For example, the first angle 7 has a value equal to 90°.

The first connection portion 5 is for example formed in one piece with the first plate 2, as in the embodiment shown in the figures.

In another embodiment, not shown, the first connection portion is attached, for example by welding, brazing or clinching, to the first plate.

The first connection surface 5 is able to be welded to a second connection surface 9 of a third busbar 10 of the power electronics module 110. The second connection surface 9 faces and is parallel to the first connection surface 5. The weld between the first connection surface 5 and the second connection surface 9 is a first laser weld produced using a first laser beam passing at a first interface 11 between the first connection surface 5 and the second connection surface 9. The first interface 11 is for example a first space between the first connection surface 5 and the second connection surface 9 that is small enough to enable welding with the first laser beam. The first space has for example a thickness less than 0.5 mm. The first interface 11 may also be a contact between the first connection surface 5 and the second connection surface 9.

The second busbar 6 comprises a second plate 12 parallel to the first plate 2 and located on a second side 13 of the first plate 2, opposite the first side 4.

The first busbar 8 or the second busbar 6 comprises a first extension 15 extending in line with the first connection surface 5. The first extension 15 is able to block the first laser beam.

In the embodiment shown in the figures, the second busbar comprises the first extension 15. For example, the first extension 15 is formed in one piece with the second plate 12. Such a first extension 15 is particularly visible in FIG. 4 and FIG. 5.

In another embodiment, not shown, the first busbar comprises the first extension. The first extension 15 is for example a third plate attached directly to the first plate 2. The direct attachment is for example a weld, a brazing joint or a clinching joint.

The first extension 15 is for example perpendicular to the first connection surface 5.

The first extension 15 extends for example by more than 0.5 mm, in particular by more than 1 mm, with respect to the projection of the first connection surface 5 on the first extension 15 in a direction perpendicular to the first extension 15.

The first housing 14 comprises a first free area 16 in line with the first connection surface 5. The first free area 16 is able to leave the first extension 15 exposed for the first laser beam. In other words, the first housing 14 does not block the first laser beam.

As may be seen in FIG. 4 and FIG. 6, the second busbar 6 may comprise a second connection portion 16 projecting from the second plate on a first side 17 of the second plate 12. The second connection portion 16 may comprise a third connection surface 18. The third connection surface 18 may form a second angle 19 with the second plate 12. For example, the second angle 19 has a value equal to 90°. The third connection surface 18 is for example able to be welded to a fourth connection surface 20 of a fourth busbar 21 of the power electronics module 110. The third connection surface may face and be parallel to the third connection surface 18. The weld between the third connection surface 18 and the fourth connection surface 20 is for example a second laser weld using a second laser beam passing at a second interface 22 between the third connection surface 18 and the fourth connection surface 20.

The second interface 22 is for example a second space between the third connection surface 18 and the fourth connection surface 20 that is small enough to enable welding with the second laser beam. The second space has for example a thickness less than 0.5 mm. The second interface 22 may also be a contact between the third connection surface 18 and the fourth connection surface 20.

The second busbar 6 may comprise a second extension 23 extending in line with the third connection surface 18. The second extension 23 may be able to block the second laser beam.

The second extension 23 is for example a fourth plate 24 attached directly to the second plate 12. The direct attachment is for example a weld, a brazing joint or a clinching joint.

The second extension 23 is for example perpendicular to the third connection surface 18.

The second extension 23 extends for example by more than 0.5 mm, in particular by more than 1 mm, with respect to the projection of the third connection surface 18 on the second extension 23 in a direction perpendicular to the second extension 23.

The second extension 23 has for example the same thickness as the first plate 2 or the same thickness as the second plate 12.

The first housing 14 may comprise a second free area 25 in line with the third connection surface 18. The second free area 25 is able to leave the second extension 23 exposed for the second laser beam. In other words, the first housing 14 does not block the second laser beam.

The first plate 2, the second plate 12, the first connection portion 3, the second connection portion 16, the first extension 15 and the second extension 23 are for example made of metal, in particular of copper or of a copper alloy.

The power electronics module 110 comprising the third busbar 10 and the fourth busbar 21 may furthermore comprise a second housing. The second housing is for example overmolded onto the third busbar 10 and the fourth busbar 21.

The voltage converter 104 may comprise a heat sink 31. The power electronics module 110 may have a heat dissipation surface 34. The heat dissipation surface 34 of the power electronics module 110 may be in thermal contact with a heat exchange surface 35 of the heat sink 31. The thermal contact is for example made by way of a thermal paste. The heat sink 31 comprises for example cooling fins 37.

In another embodiment of the invention, not shown, the heat sink comprises a cooling circuit for a cooling fluid.

The voltage converter 104 may furthermore comprise an electronic control module 30 intended to generate the control signal that is applied to the control terminal 120. The electronic control module 30 is for example mounted in a casing 36 that is mounted on the first heat sink 31.

The voltage converter 104 may comprise a terminal block 38 intended to be connected to the power source 102. The terminal block 38 may comprise two terminals that are electrically connected to the positive electric line 106 and to the negative electric line 108.

The invention claimed is:

1. An electronic unit for a voltage converter of a rotating electric machine comprising:
    a first busbar comprising:
    a first plate,
    a first connection portion projecting from the first plate, on a first side of the first plate, the first connection portion comprising a first connection surface, the first connection surface forming a first angle with the first plate, the first connection surface being able to be welded to a second connection surface, facing and parallel to the first connection surface, of a third busbar of a power electronics module by a first laser weld using a first laser beam passing at a first interface between the first connection surface and the second connection surface,
    a second busbar separate from the first busbar and comprising a second plate parallel to the first plate and located on a second side of the first plate, opposite the first side,
    a first housing electrically isolating the first busbar from the second busbar,
    wherein the first busbar or the second busbar comprises a first extension extending in line with the first connection surface, the first extension being able to block the first laser beam, and
    wherein the first housing comprises a first free area in line with the first connection surface, the first free area being able to leave the first extension exposed for the first laser beam.

2. The electronic unit for a voltage converter of a rotating electric machine as claimed in claim 1, wherein the first extension is perpendicular to the first connection surface.

3. The electronic unit for a voltage converter of a rotating electric machine as claimed in claim 2, wherein the first extension extends by more than 0.5 mm, in particular by more than 1 mm, with respect to the projection of the first connection surface on the first extension in a direction perpendicular to the first extension.

4. The electronic unit for a voltage converter of a rotating electric machine as claimed in claim 3, wherein the first connection portion is formed in one piece with the first plate.

5. The electronic unit for a voltage converter of a rotating electric machine as claimed in claim 1, wherein the first extension is formed in one piece with the second plate.

6. The electronic unit for a voltage converter of a rotating electric machine as claimed in claim 1, wherein the first extension is a third plate attached directly to the first plate.

7. The electronic unit for a voltage converter of a rotating electric machine as claimed in claim 1, wherein the second busbar comprises a second connection portion projecting from the second plate, on a first side of the second plate, the second connection portion comprising a third connection surface, the third connection surface forming a second angle with the second plate, the third connection surface being able to be welded to a fourth connection surface, facing and parallel to the third connection surface, of a fourth busbar of a power electronics module by a second laser weld using a second laser beam passing at a second interface between the third connection surface and the fourth connection surface,
    the second busbar comprising a second extension extending in line with the third connection surface, the second extension being able to block the second laser beam,
    the second extension being a fourth plate attached directly to the second plate, and
    wherein the first housing comprises a second free area in line with the third connection surface, the second free area being able to leave the second extension exposed for the second laser beam.

8. The electronic unit for a voltage converter of a rotating electric machine as claimed in claim 1, wherein the first housing is overmolded onto the first busbar and the second busbar.

9. The electronic unit for a voltage converter of a rotating electric machine as claimed in claim 1, comprising a capacitor, a first terminal of which is electrically connected directly to the first busbar, in particular by welding, brazing or crimping, and a second terminal of which is electrically connected directly to the second busbar, in particular by welding, brazing or crimping.

10. The electronic unit for a voltage converter of a rotating electric machine as claimed in claim 9, wherein the first housing comprises a wall forming a chimney surrounding the first terminal and the second terminal, the chimney being able to receive a protective resin so as to protect the electrical connection between the first busbar and the first terminal and the electrical connection between the second busbar and the second terminal.

11. The electronic unit for a voltage converter of a rotating electric machine as claimed in claim 1, wherein the first angle has a value equal to 90°.

12. A voltage converter of a rotating electric machine comprising an electronic unit for a voltage converter of a rotating electric machine as claimed in claim 1 and a power electronics module able to supply electric power to a winding of a rotating electric machine.

13. The voltage converter as claimed in claim 12, wherein the first busbar is a negative busbar and the second busbar is a positive busbar.

14. The voltage converter as claimed in claim 12, wherein the power electronics module comprises a third busbar and a fourth busbar, the first busbar being welded to the third busbar by a first laser weld and the second busbar being welded to the fourth busbar by a second laser weld.

15. An electrical assembly comprising a voltage converter as claimed in claim 12 and a rotating electric machine.

16. The electronic unit for a voltage converter of a rotating electric machine as claimed in claim 2, wherein the first extension is formed in one piece with the second plate.

17. The electronic unit for a voltage converter of a rotating electric machine as claimed in claim 4, wherein the first extension is a third plate attached directly to the first plate.

18. The electronic unit for a voltage converter of a rotating electric machine as claimed in claim 2, wherein the second busbar comprises a second connection portion projecting from the second plate, on a first side of the second plate, the second connection portion comprising a third connection surface, the third connection surface forming a second angle with the second plate, the third connection surface being able to be welded to a fourth connection surface, facing and parallel to the third connection surface, of a fourth busbar of a power electronics module by a second laser weld using a second laser beam passing at a second interface between the third connection surface and the fourth connection surface, the second busbar comprising a second extension extending in line with the third connection surface, the second extension being able to block the second laser beam, the second extension being a fourth plate attached directly to the second plate, and wherein the first housing comprises a second free area in line with the third connection surface, the second free area being able to leave the second extension exposed for the second laser beam.

19. The electronic unit for a voltage converter of a rotating electric machine as claimed in claim 2, wherein the first housing is overmolded onto the first busbar and the second busbar.

20. The electronic unit for a voltage converter of a rotating electric machine as claimed in claim 2, comprising a capacitor, a first terminal of which is electrically connected directly to the first busbar, in particular by welding, brazing or crimping, and a second terminal of which is electrically connected directly to the second busbar, in particular by welding, brazing or crimping.

\* \* \* \* \*